US012710452B2

(12) United States Patent
Zhao et al.

(10) Patent No.: US 12,710,452 B2
(45) Date of Patent: Aug. 18, 2026

(54) BATTERY SYSTEM AND HYBRID CURRENT SENSOR THEREFOR

(71) Applicant: Suzhou Littelfuse OVS Co., Ltd., Suzhou (CN)

(72) Inventors: Jianfei Zhao, Suzhou (CN); Engelbert Hetzmannseder, Chicago, IL (US)

(73) Assignee: Suzhou Littelfuse OVS Co., Ltd., Suzhou (CN)

( * ) Notice: Subject to any disclaimer, the term of this patent is extended or adjusted under 35 U.S.C. 154(b) by 186 days.

(21) Appl. No.: 18/685,023

(22) PCT Filed: Mar. 31, 2022

(86) PCT No.: PCT/CN2022/084252
§ 371 (c)(1),
(2) Date: Feb. 20, 2024

(87) PCT Pub. No.: WO2023/019958
PCT Pub. Date: Feb. 23, 2023

(65) Prior Publication Data

US 2024/0369600 A1 Nov. 7, 2024

(30) Foreign Application Priority Data

Aug. 20, 2021 (CN) ......................... 202110960920.8
Dec. 30, 2021 (CN) ......................... 202111652183.1

(51) Int. Cl.
*G01R 15/20* (2006.01)
*G01R 15/09* (2006.01)
*G01R 19/00* (2006.01)

(52) U.S. Cl.
CPC ........... *G01R 15/207* (2013.01); *G01R 15/09* (2013.01); *G01R 15/202* (2013.01); *G01R 19/0092* (2013.01)

(58) Field of Classification Search
CPC .......................... G01R 19/0092; G01R 31/006
See application file for complete search history.

(56) References Cited

U.S. PATENT DOCUMENTS 7,545,136 B2 * 6/2009 Racz .................... G01R 15/207 324/117 R
9,746,499 B2 * 8/2017 Chae ...................... G01R 1/203
(Continued)

FOREIGN PATENT DOCUMENTS

CN 104007305 A 8/2014
CN 104345204 A 2/2015
(Continued)

OTHER PUBLICATIONS

International Search Report and Written Opinion for International Application No. PCT/CN2022/084252, filed on Mar. 31, 2022, 10 pages.

(Continued)

*Primary Examiner* — Dominic E Hawkins
(74) *Attorney, Agent, or Firm* — KDW Firm PLLC

(57) ABSTRACT

A hybrid current sensor (104, 204, 304, 404, 504, 554, 604, 624, 644, 664) may include a main conductor (206, 306, 406), having a first end (220) and a second end (222), wherein a current flow direction extends between the first end (220) and the second end (222), as well as a magnetic core (208, 308, 408), disposed at least partially around a middle portion of the main conductor (206, 306, 406). The magnetic core (208, 308, 408) may define a core gap region (226) above a first surface of the main conductor (206, 306, 406), where a chip assembly (218, 518, 618, 628) is disposed within the core gap region (226). As such, in a first portion the core gap region (226) has a first gap (G1) along a transverse direction, perpendicular to the current flow direction, and wherein in a second portion the core gap region (Continued)

(226) has a second gap (G2) along the transverse direction, greater than the first gap (G1).

20 Claims, 12 Drawing Sheets

(56) References Cited

U.S. PATENT DOCUMENTS

2005/0161809 A1* 7/2005 Nakatsu ................ H02M 7/003 257/734
2006/0232262 A1* 10/2006 Tanizawa ............. G01R 15/183 324/117 H
2007/0164727 A1 7/2007 Racz
2007/0178723 A1* 8/2007 Kataoka ............... H05K 1/0263 439/76.2
2008/0316655 A1* 12/2008 Shoji .................... G01R 33/093 360/324.1
2009/0039880 A1 2/2009 Nomura
2009/0091312 A1* 4/2009 Ito .......................... G01D 5/147 324/207.2
2016/0313373 A1 10/2016 Plagne
2017/0010310 A1* 1/2017 Morel .................. G01R 15/207
2017/0261536 A1* 9/2017 Chae .................... G01R 15/146
2018/0038897 A1 2/2018 Milano
2020/0011902 A1* 1/2020 Shimizu ............. G01R 19/0092
2020/0056910 A1* 2/2020 Strutz ................ G01R 33/0076
2020/0166548 A1* 5/2020 Kolli .................... G01R 15/207
2020/0191835 A1* 6/2020 Bilbao De Mendizabal ............... G01R 33/0011
2022/0163569 A1* 5/2022 Labbe ................ G01R 19/0092

FOREIGN PATENT DOCUMENTS

CN 105044427 A 11/2015
JP 3234394 A 8/1995
JP H07218552 A 8/1995
JP 2002303642 A 10/2002
JP 2006292692 A 10/2006
JP 2007192820 A 8/2007
JP 2015083941 A 4/2015
JP 2016206195 A 12/2016

OTHER PUBLICATIONS

Extended European Search Report for EP Application No. 22857277.2, dated Jan. 7, 2025, 10 pages.

* cited by examiner 204
214
216
210
226
206
P1
Z
Y
X

222
G1
214
208
L1
L3
210
L2
L4
226
216
212
G2

204
X
Y
Z
206
224
222
228
h1
218
P1
214
216
210
208
P2
212
h2
206

204
224
Z
Y
X
230
214
216
206
G1
210
G2
P2

204
226
212

BATTERY SYSTEM AND HYBRID CURRENT SENSOR THEREFOR

RELATED APPLICATIONS

This application is a national phase application claiming the benefit of and priority to International Patent Application No. PCT/CN22/84252, filed Mar. 31, 2022, which claims the benefit of priority to Chinese Patent Application No. 202110960920.8, filed Aug. 20, 2021, and further claims priority to Chinese Patent Application No. 202111652183.1 filed Dec. 30, 2021, which application is incorporated herein by reference in its entirety.

BACKGROUND

In the present day, the current capability for battery systems for electric vehicles is increasing. Hybrid electric vehicles (HEVs) and electric vehicles (EVs) implement solid-state batteries, similar to smartphone batteries but on a much larger scale. Battery management systems (BMSs) require high-precision current measurement to meet a variety of operating modes. Vehicle propulsion and battery charging are examples of operating in the high current range, while vehicle-off communication is an example of operating in a low-current range. In some examples, currents in HEVs or EVs as high as 2000 A or more may be supported. Various sensors may be used to monitor current, including Hall sensors, for example. Many contactless current sensors in battery systems may be based upon monitoring of magnetic fields where a sensor includes a magnetic core structure that surrounds a current conductor. Given the large range of current that may be monitored in present-day HEV/EV battery systems, these known sensors may suffer from measurement errors, especially in the high current regime or low current regime. For example, the linearity of response due to magnetic core saturation may degrade at high current levels for some sensor designs, while for other sensor designs, excessive noise may be generated at low current levels.

With respect to these and other considerations, the present disclosure is provided.

BRIEF SUMMARY

In one embodiment, a hybrid current sensor is provided. The hybrid current sensor may include a main conductor, having a first end and a second end, wherein a current flow direction extends between the first end and the second end. The hybrid current sensor may include a magnetic core, disposed at least partially around a middle portion of the main conductor, where magnetic core defines a core gap region above a first surface of the main conductor, as well as a chip assembly, disposed within the core gap region. As such, a first portion of the core gap region may include a first gap along a transverse direction, perpendicular to the current flow direction, while a second portion the core gap region has a second gap along the transverse direction, greater than the first gap.

In another embodiment, a battery system may include a battery to output a main current in a vehicle. The battery system may include a hybrid current sensor, coupled to measure the main current along a current flow direction. The hybrid current sensor may include a busbar structure having a first end and a second end; a magnetic core, disposed at least partially around the busbar structure, where the magnetic core defines a core gap region above a first surface of the busbar. The hybrid current sensor may also include a chip assembly, disposed within the core gap region. As such, the magnetic core in a first portion may define a C-shape along a first transverse plane, perpendicular to the current flow direction, while in a second portion the magnetic core defines a U-shape along a second transverse plane, perpendicular to the current flow direction.

In a further embodiment, a hybrid current sensor is provided, including a busbar structure, adapted to conduct a main current along a current flow direction. The hybrid current sensor may also include a magnetic core, disposed at least partially around the busbar structure, the magnetic core having a U-shape structure within a plane that extends perpendicularly to the current flow direction, wherein the U-shaped structure defines a core gap region above a first surface of the busbar structure. The hybrid current sensor may also include a chip assembly, disposed within the core gap region, wherein a pole piece is disposed within in a first portion the core gap region, and wherein no pole piece is disposed within a second portion of the core gap region.

BRIEF DESCRIPTION OF THE DRAWINGS

FIG. 13A-FIG. 13B show a top perspective view of additional current sensors, according to further embodiments of the disclosure;

DETAILED DESCRIPTION

Improved current sensors based upon a hybrid sensor core structure, and battery systems based upon the current sensors are disclosed herein. The improved current sensors may be referred to herein as hybrid current sensors, meaning that the current sensors combine structural elements from different types of current sensors in a novel fashion.

Figure 1:
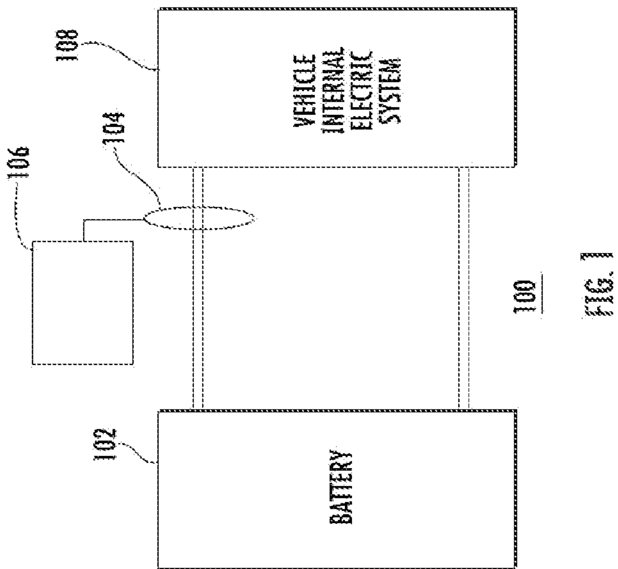
FIG. 1 is a representative drawing of a battery system, according to exemplary embodiments.

FIG. 1 is a representative drawing of battery system 100, in accordance with embodiments of the disclosure. The battery system 100 may generally be any system having components that receive current from a battery. For example, the battery system 100 may be suitable for implementation in conjunction with EV or HEV according to different embodiments. The battery 102, as shown in FIG. 1, may be coupled to a vehicle internal electrical system 108, where the vehicle internal electrical system 108 may include multiple components including inverter, motor, and so forth, as known in the art. The battery 102 may represent an array of individual batteries, and may be capable of generating a current in the range up to 2000 A, according to various non-limiting embodiments of the disclosure.

The battery system 100 further includes a hybrid current sensor 104 and controller 106. Different variants of the hybrid current sensor 104 will be described in more detail with respect to the figures to follow. In brief, the hybrid current sensor 104 may have a novel magnetic core structure including at least two general core portions or regions having different shape that provide improved current sensing capability. The hybrid current sensor 104 may be arranged in any suitable location to sense electric current propagating within the battery system 100.

The battery system 100 further includes a controller 106, such as a microcontroller, coupled to the hybrid current sensor 104, in order to provide more accurate current measurement, as detailed below. In some examples, the hybrid current sensor 104 may include multiple sensor elements, such as integrated circuit chips, where the different sensor elements are suitable for measuring current over different current ranges. The controller 106 may include logic or related circuitry to best interrogate the sensor elements of the hybrid current sensor 104 over different current ranges, in order to provide more accurate current sensing.

Figure 2:
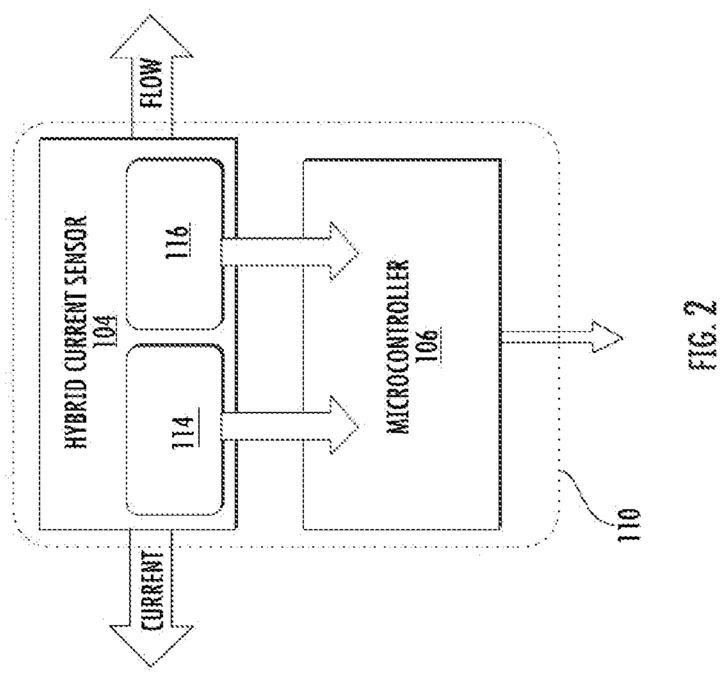
FIG. 2 presents details of one embodiment of a sensor arrangement.

FIG. 2 presents details of one embodiment of a sensor arrangement 110. In this example, the hybrid current sensor 104 is coupled to the controller 106, shown as a microcontroller. The hybrid current sensor 104 may include a magnetic core portion (not specifically shown) having a novel hybrid structure, as well as a low current integrated circuit (IC) chip 114 and a high current IC chip 116. These different chips may include Hall sensor elements or xMR (extreme magnetoresistance) elements, and may be arranged in different regions of the magnetic core portion, in order to provide improved current sensing capability over a range of current conditions, as detailed below. The controller 106 may receive the output signals from the low current IC chip 114 and high current IC chip 116, and may deal with the received signals to extract the current information for a battery system accordingly.

FIG. 3A to FIG. 3E show various views of a hybrid current sensor 204, according to embodiments of the disclosure. The hybrid current sensor 204 may represent a variant of the hybrid current sensor 104, discussed above. The hybrid current sensor 204 is coupled to measure current in a battery system, such as battery system 100, described above. As such, the hybrid current sensor 204 may include a main conductor 206, arranged within a main current path of an electric vehicle, where the direction of current flow is illustrated by the directional arrow, in this case parallel to the X-axis of the Cartesian coordinate system shown. The main conductor 206 may represent a busbar, for example, or similar electrically conductive element, which element may be directly or indirectly coupled to a battery, for example.

Figure 3A:
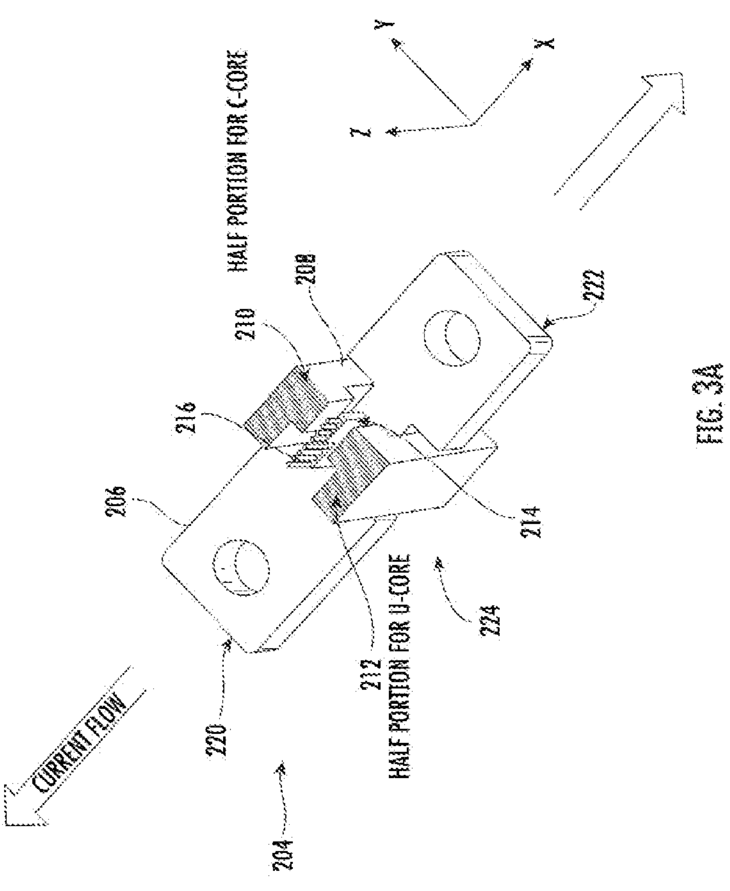
FIG. 3A shows a top perspective view of a hybrid current sensor, according to embodiments of the disclosure.

As shown in FIG. 3A, the main conductor 206 has a first end 220 and a second end 222, where the current flow direction extends between the first end 220 and the second end 222, and thus, the current flow is generally parallel to the X-axis, as noted above. The hybrid current sensor 204 includes a magnetic core 208, disposed at least partially around a middle portion 224 of the main conductor 206. The middle portion 224 may be generally any location of the main conductor 206 between the first end 220 and the second end 222, and not necessarily a location that is midway between the first end 220 and the second end 222.

Figures 3B, 3C, 3D, 3E:
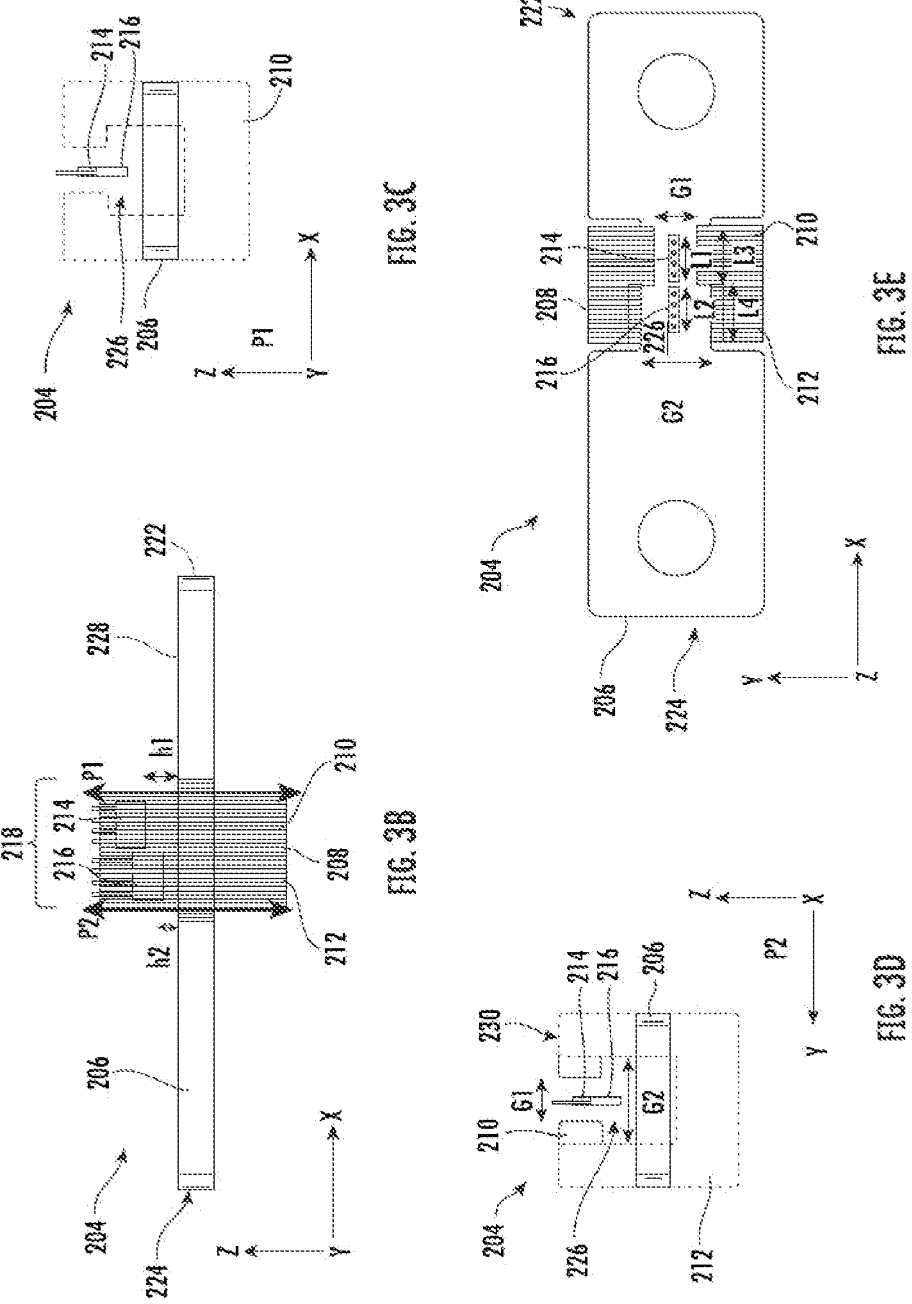
FIG. 3B shows a side view of the hybrid current sensor of FIG. 3A.
FIG. 3C shows a first end view of the hybrid current sensor of FIG. 3A.
FIG. 3D shows a second end view of the hybrid current sensor of FIG. 3A.
FIG. 3E shows a top plan view of the hybrid current sensor of FIG. 3A.

The magnetic core 208 has a somewhat complex shape, whose various features also will be detailed with respect to FIGS. 3B-3E. Briefly, with reference in particular to FIGS. 3B-3D, the magnetic core 208 includes a first portion 210 that defines a C-shape within a first plane, extending perpendicularly to the current flow direction along a first vertical surface of the magnetic core 208. Said differently, as shown in FIG. 3B, a first plane P1 (parallel to the Y-Z plane, and perpendicular to the X-axis) is shown on the right hand vertical surface of the magnetic core 208. The shape of the magnetic core in P1 is a C-shape, as shown by the view in FIG. 3C, parallel to the Y-Z plane. Additionally, the magnetic core 208 includes a second portion 212 that defines a U-shape within a second plane, extending parallel to the first plane along a second vertical surface of the magnetic core. Said differently, as shown in FIG. 3B, a second plane P2 (parallel to the Y-Z plane, and perpendicular to the X-axis) is shown on the left hand vertical surface of the magnetic core 208. The shape of the magnetic core in this second plane P2 is a U-shape, as shown by the view in FIG. 3D, parallel to the Y-Z plane.

In FIGS. 3C to FIG. 3E, there is shown a further feature of the hybrid current sensor 204, resulting from the C-shape of the first portion 210 and the U-shape of the second portion 212. As such, the magnetic core 208 forms a core gap region 226 above a first surface 228 of the main conductor 206, where the core gap region 226 defines different gaps in different regions: a first gap G1 along a transverse direction (Y-axis), perpendicular to the current flow direction (X-axis), and a second gap G2 along the transverse direction, where second gap G2 is greater than the first gap G1. In other words, the "bent arms" of the upper part of the C-shaped region (first portion 210) form a smaller gap G1 than the gap G2 formed by the "straight arms" of the U-shaped region (second portion 212).

As further shown in FIGS. 3C-3E, a chip assembly 218 is disposed within the core gap region 226. In this embodiment, the chip assembly 218 includes a low current chip 214

(which may be similar to the low current IC chip 114), disposed within the first gap G1, and further comprises a high current chip 216 (which may be similar to the high current IC chip 116), disposed within the second gap G2. In the top plan view of FIG. 3E the core gap region 226 defines a T-shape along an upper surface 230 of the magnetic core 208, above the first surface 228 of the main conductor 206. This T-shaped core gap region accommodates the low current chip 214 in a relatively smaller space defined by the first gap G1 than the relatively larger space formed by the second gap G2, in which space the high current chip 216 is disposed.

As further shown in FIG. 3B, the low current chip 214 is disposed a first distance (shown as h1) above the first surface 228, and the high current chip 216 is disposed a second distance (shown as h2) above the first surface 228, less than the first distance. In particular, the low current chip 214 is disposed at a height above the first surface 228 that places the low current chip 214 in the narrow part of the core gap region 226, defined by the gap G1, and located between the "bent arms" of the first portion 210. Thus, the separation of the low current chip 214 from the bent arms of the magnetic core 208 is less than the separation of the high current chip 216 from the straight arms of magnetic core 208.

In operation, the hybrid current sensor 204 will measure current conducted through the main conductor 206, which current may represent current in an EV. Notably, as discussed previously, current range for vehicle propulsion may range up to 2000 A, while vehicle off-communication may entail much lower current, for example, in the range less than 100 A.

In practice, the chip assembly 218 will include sensor elements to detect a magnetic field, where the field strength is proportional to the load current on a main conductor 206, such as a busbar. Note that according to various embodiments of the disclosure, the low current chip 214 and high current chip 216 may have the same circuitry, while during calibration of the hybrid current sensor 204, the gain value set up for the low current chip 214 will be different than the gain value for the high current chip 216.

An advantage provided by the hybrid current sensor 204 is the ability to better measure current in both a low current range and a high current range. More particularly, the first portion 210, having a C-shape, will act to concentrate a magnetic field when current is low, e.g. ±100 A. By placing the low current chip 214 (such as a Hall sensor-based integrated circuit chip) in the part of the core gap region 226 defined by gap G1, current sensing is more accurate, and current measurement noise level is lower, that is, magnetic field measurement noise level is lower. On the other hand, the second portion 212, having a U-shape, where the gap G2 is relatively larger, is more suitable for measurement of high current levels, such as 1500 A or greater, where the relatively larger gap may avoid magnetic core saturation that would otherwise occur at such high current levels using relatively smaller gaps.

In order to optimize sensor response and get better external stray field suppression, in some embodiments, as illustrated in FIG. 3E, the low current chip 214 and the high current chip 216 extend along the X-axis to a lesser extent than the respective first portion 210 and second portion 212. Thus, the length L1 of the low current chip 214 is less than the length L3 of first portion 210, while the length L2 of the high current chip 216 is less than the length L4 of second portion 212.

Advantageously, the controller 106 may interrogate both the low current chip 214 and the high current chip 216 so that the best current measurement may be determined according to the level of current being measured. To further illustrate this point, FIG. 4 illustrates current magnetic field as a function of main conductor current for the components of a chip assembly, according to embodiments of the disclosure. In this example, two different curves are shown, where the IC1 curve represents the magnetic field (magnetic flux density) curve for the low current chip 214, while the IC2 curve represents the magnetic field curve for the high current chip 216. As illustrated, the magnetic field increases much more rapidly with increasing main conductor current for IC1 curve. Thus, the detected magnetic field will be a more accurate measurement of actual main conductor current, which factor makes the use of the low current chip 214 appropriate for accurately measuring relatively lower current levels, such as current levels up to approximately 500 amps, in particular.

Figure 4A:
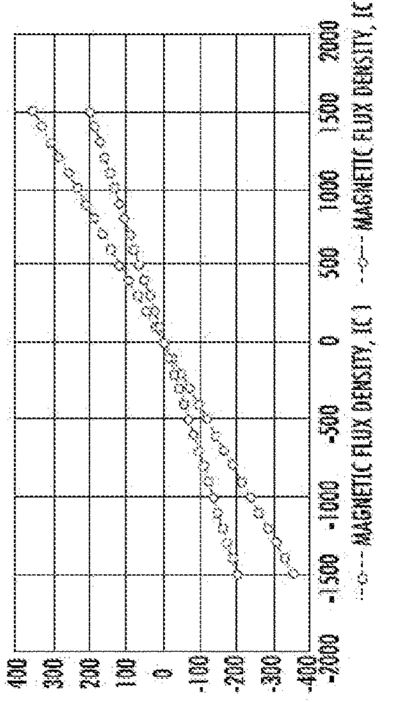
FIG. 4A illustrates current magnetic field as a function of main conductor current for the components of a chip assembly, according to embodiments of the disclosure.
Figure 4B:
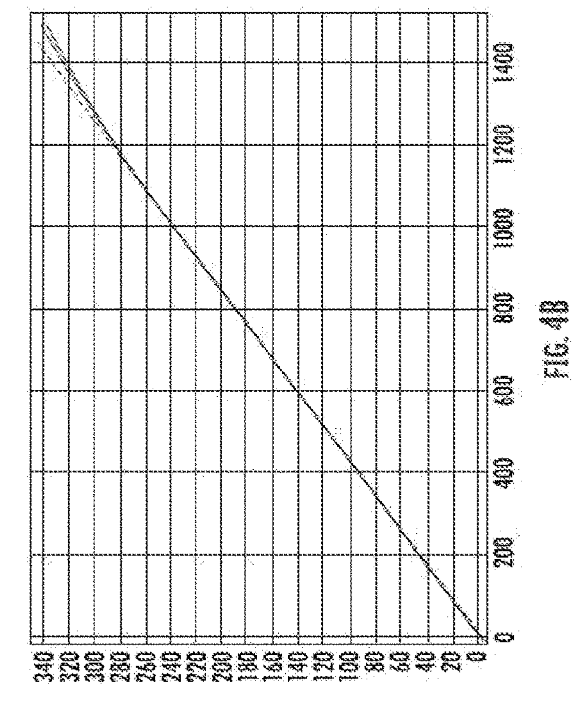
FIG. 4B illustrates current magnetic field as a function of main conductor current for a known sensor arrangement.

While the magnetic field increases much more slowly with increasing main conductor current for the IC2 curve, this property is useful for measuring relatively higher current, such as above 1000 A. In other words, by maintaining the relative flux density at a relatively lower level for high current values, saturation may be avoided, which saturation would otherwise lead to measurement errors. To illustrate this point further, FIG. 4B illustrates current magnetic field as a function of main conductor current for a known sensor arrangement. In this case, the curve represents the flux density for a magnetic core design employing a C-shape-only structure, where the entire core has a C-shape, as in known designs. As shown, a strong non-linearity in magnetic flux as a function of increasing current takes place at current levels above 1200 A, due to saturation of the magnetic core having the C-shape.

Said differently, because the U-shape portion of a hybrid current sensor may be used for high current measurements, the inherent non-linearity exhibited by C-shape design at high current levels may be avoided. Thus, a range of designs for the C-shape portion of the hybrid current sensor may be used in the present embodiments, because current measurement at high current levels is performed using the U-shaped portion. To illustrate this point, FIGS. 9A-9F provide further examples of C-shape design that may be suitable for the first portion 210, according to embodiments of the disclosure. In these examples, the material of C-shaped portion may be assumed to be a silicon steel, with a high permeability, such as a relative permeability in a range above 2000, such as above 2500. However, other non-limiting embodiments may use other materials with a suitable permeability, such as a permeability in a range of 1000 to several thousand or more.

Figure 9C:
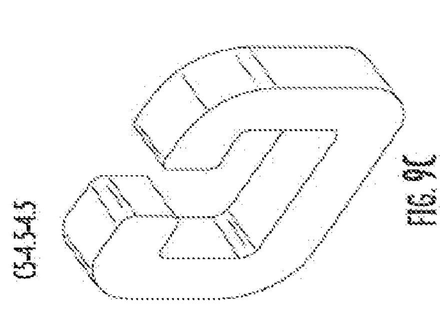
FIG. 9C and FIG. 9D show a top perspective view and side cross-sectional view of another embodiment of a C-shape magnetic core portion according to further embodiments.
Figure 9A:
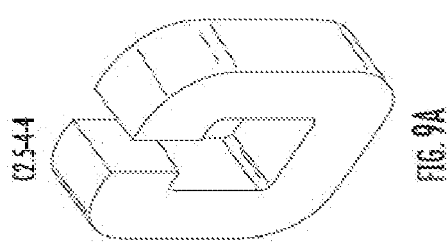
FIG. 9A and FIG. 9B show a top perspective view and side cross-sectional view of an embodiment of a C-shape magnetic core portion according to some embodiments.
Figure 9D:
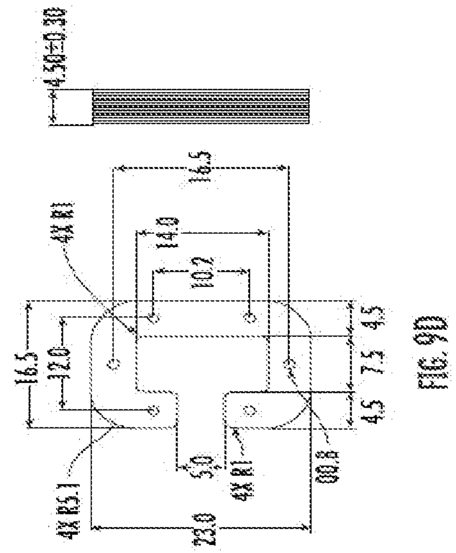
Figure 9B:
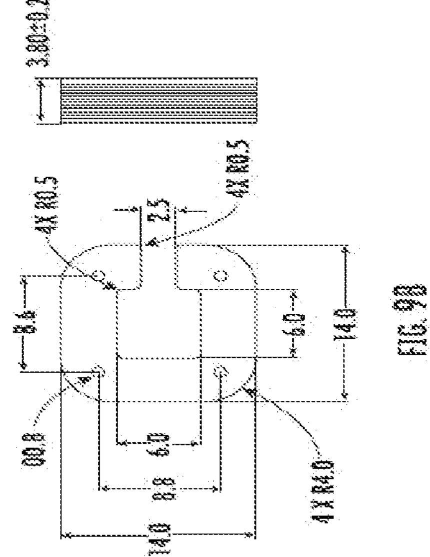
Figure 9F:
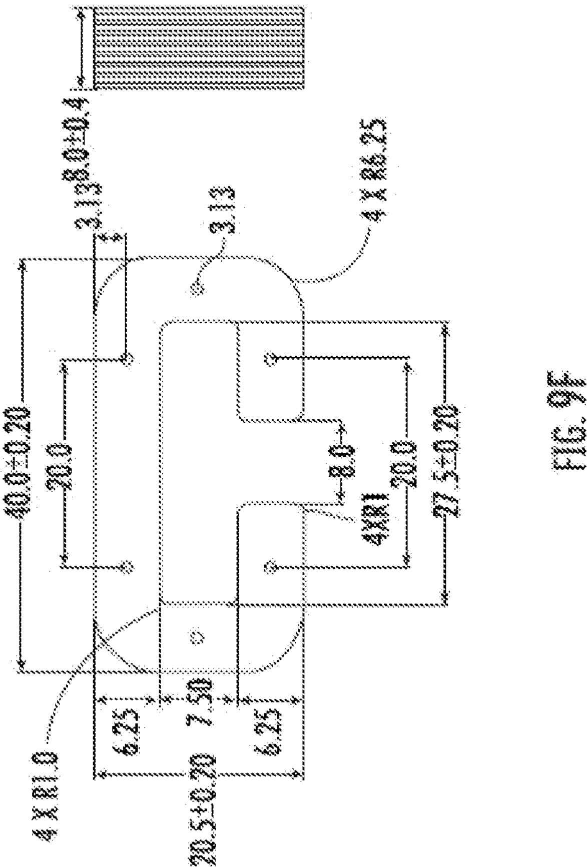
FIG. 9E and FIG. 9F show a top perspective view and side cross-sectional view of a further embodiment of a C-shape magnetic core portion according to additional embodiments.
Figure 9E:
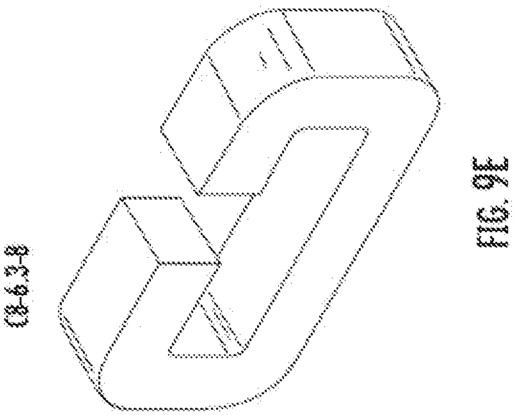

FIG. 9A and FIG. 9B show a top perspective view and side cross-sectional view of an embodiment of a C-shape magnetic core portion according to some embodiments. FIG. 9C and FIG. 9D show a top perspective view and side cross-sectional view of another embodiment of a C-shape magnetic core portion according to further embodiments. FIG. 9E and FIG. 9F show a top perspective view and side cross-sectional view of a further embodiment of a C-shape magnetic core portion according to additional embodiments. In each of these non-limiting embodiments, the gap size and the height and length of the opposing faces of the core portion at the gap are shown in millimeters.

Figure 10:
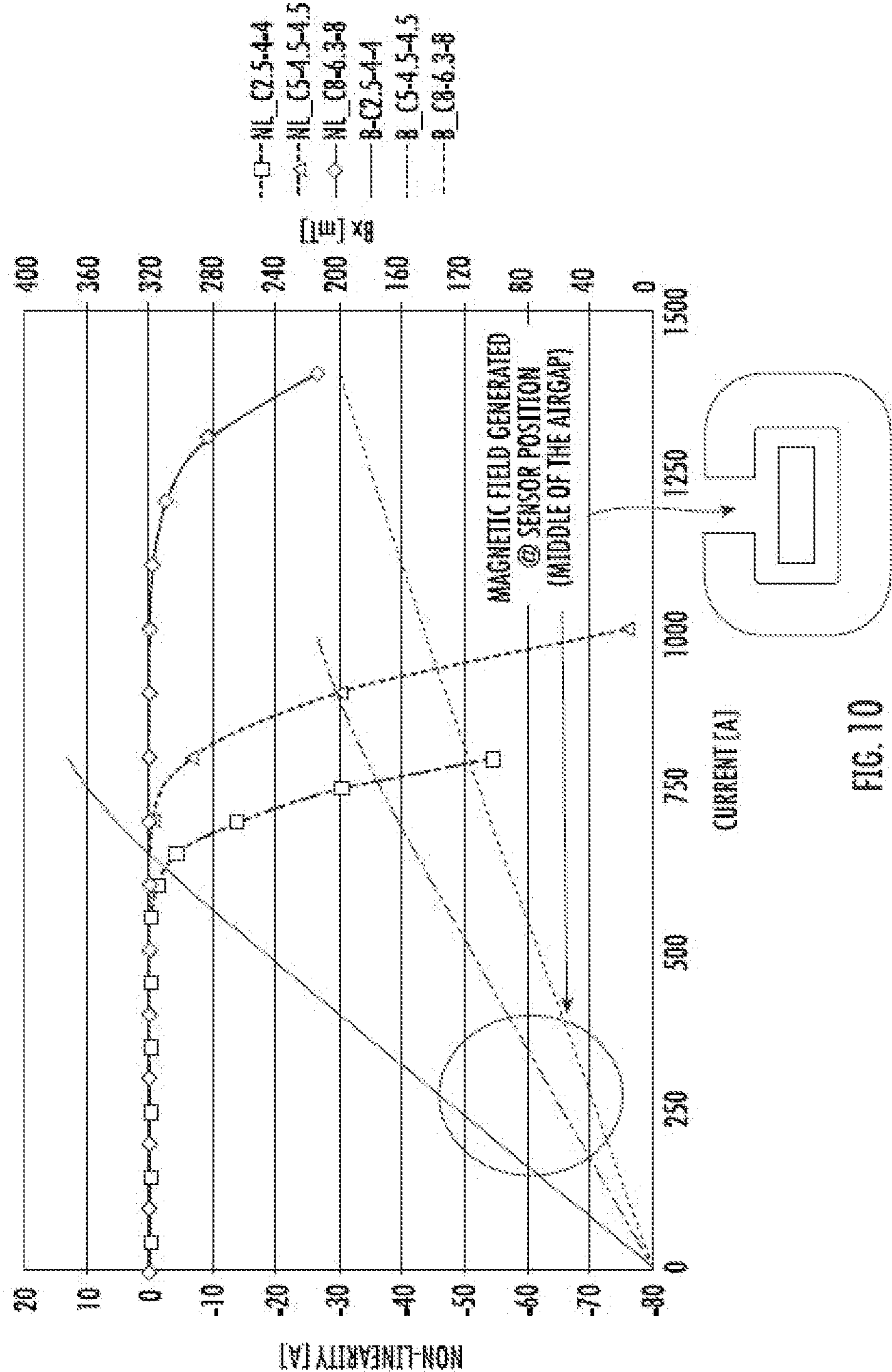
FIG. 10 shows the resulting magnetic field measurements (dashed line) as well as non-linearity amount as a function of main current for the different C-core designs of FIGS. 9A, 9C, and 9E.

FIG. 10 shows the resulting magnetic field measurements (dashed line) as well as non-linearity amount (solid line) as a function of main current for the different C-core designs of FIGS. 9A, 9C, and 9E. In the design of FIG. 9E the non-linearity does not appear until a main current level of approximately 1100 A is reached, while in the design of FIG.

9A, the non-linearity appears at a main current level of approximately 550 A. On the other hand, the magnetic field at low current values increases more rapidly with main current in the design of FIG. 9A. Thus, all the designs of FIGS. 9A-9F may be suitable for use as the first portion 210 of a hybrid current sensor, where the second portion 212 may be designed to measure main current above values of approximately 500 A. Said differently, the designs of FIGS. 9A-9F may be suitable for use as the first portion 210 of a hybrid current sensor, wherein the first portion 210 is designed to measure current at levels below 500 amps, and in some cases at 100 amps or less.

Note that in the embodiment of FIGS. 3A-3E the main conductor 206 has a busbar with a notch design to accommodate the magnetic core 208, in order to place the opposing arms of the magnetic core 208 closer to one another so as to generate a stronger magnetic field. In other embodiments a notch portion in the main conductor 206 may be omitted, such as in applications where an IC chip does not need a relatively higher magnetic field.

Figure 5:
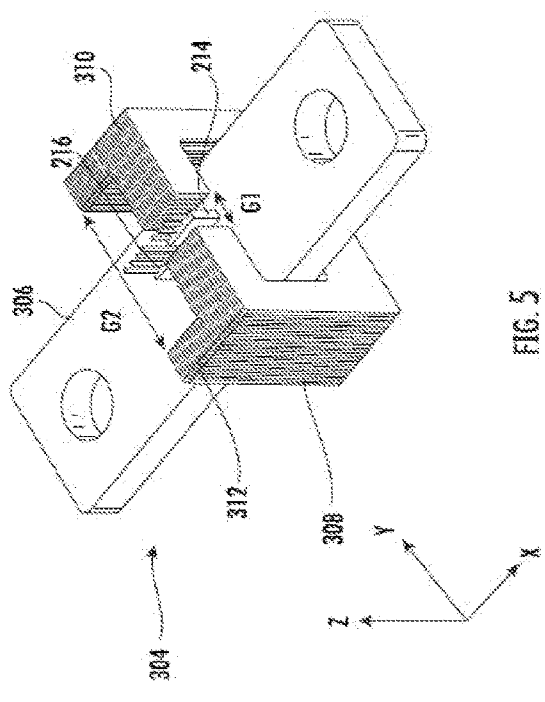
FIG. 5 shows a top perspective view of another hybrid current sensor, according to embodiments of the disclosure.

FIG. 5 shows a top perspective view of another hybrid current sensor 304, according to embodiments of the disclosure. In this embodiment, the hybrid current sensor 304 may include a main conductor 306 that is not notched, for simpler design. The hybrid current sensor 304 includes a magnetic core 308, having the same general structure of the magnetic core 208, described above, including a first portion 310 that is C-shaped, and a second portion 312 that is U-shaped. In the hybrid current sensor 304, the function of these different portions of magnetic core 308 will be similar to the function described for respective first portion 210 and second portion 212 of magnetic core 208. The absence of a notch in the busbar structure of the main conductor 306 leads to a relatively wider magnetic core 308, along the Y-axis. This relatively wider dimension leads to a relatively wider second gap G3 in the second portion 312 of magnetic core 308, in comparison to the second gap G2 of magnetic core 208. Thus, the magnetic flux density for high current chip 216 will be relatively lower, which circumstance may be adequate for applications where the high current chip 216 is adapted for measurement in the presence of relatively lower magnetic field.

In other embodiments of the disclosure a magnetic core may be provided with pole pieces to create an effective smaller first gap in a first portion.

Figure 6:
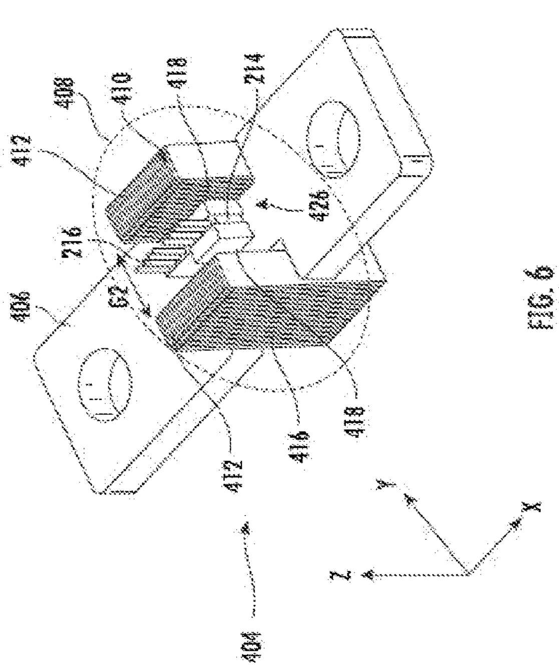
FIG. 6 shows a top perspective view of a further hybrid current sensor, according to embodiments of the disclosure.

FIG. 6 shows a top perspective view of a further hybrid current sensor, shown as hybrid current sensor 404, according to additional embodiments of the disclosure. In this embodiment, the hybrid current sensor 404 may include a main conductor 406 that is a notched busbar structure, as in the case of main conductor 206. The hybrid current sensor 404 includes a magnetic core 408, having a main portion 416 of the magnetic core 408, that has a general U-shape. In a gap region 426 within the U-shaped main portion, main portion 416, a pole piece 418 is located toward the front of the magnetic core 408, along the X-axis, in the view of FIG. 6. Locating the pole piece 418 in this region effectively creates a first portion 410 of the magnetic core 408 and a second portion 412 of the magnetic core 408. The second portion 412, where no pole piece is present, may be similar to the second portion 212 of magnetic core 208, defining a similar gap, G2. The first portion 410, by virtue of the pole piece being located between the U-shaped arms, may effectively have a smaller gap, thus concentrating the magnetic field to create a higher magnetic flux density in the vicinity of low current chip 214. In this manner the magnetic core 408 may provide a similar magnetic response features for the low current chip 214 and high current chip 216, as the magnetic core 208, and as generally shown in FIG. 4A.

In summary, by providing a hybrid structure for a magnetic core, the present embodiments provide an additional current sensing channel, especially suitable for measuring the small current range with significantly improved sensing resolution as well as reduced output error on the high current range. A further demonstration of the advantages provided by the present embodiments, is illustrated with respect to FIG. 7 and FIG. 8. In particular, FIG. 7 shows a side view geometry for a hybrid sensor of the present embodiments, within an external magnetic field, and FIG. 8 shows the signal deviation caused by a stray magnetic field for a hybrid current sensor according to the present embodiments.

Figures 7, 8:
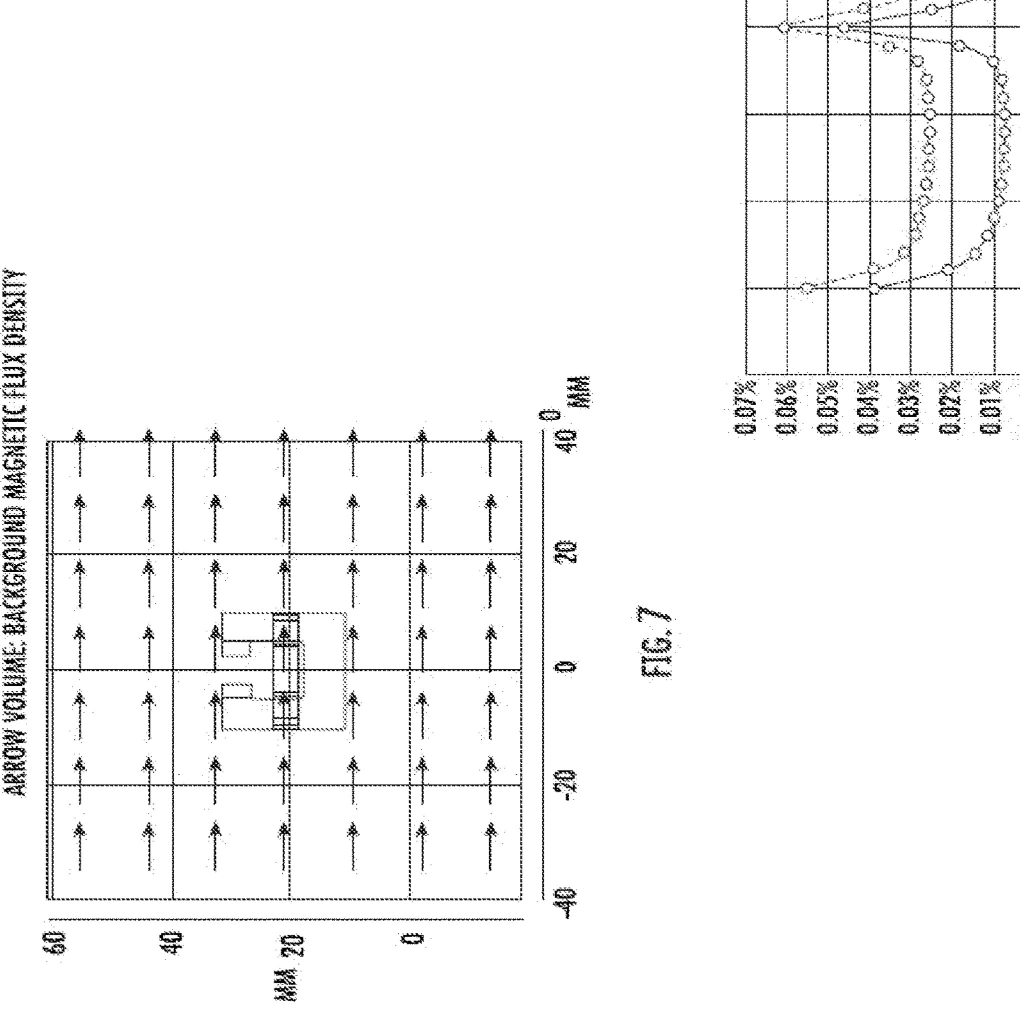
FIG. 7 shows a side view geometry for a hybrid sensor of the present embodiments, within an external magnetic field.
FIG. 8 shows the signal deviation caused by a stray magnetic field for a hybrid current sensor according to the present embodiments.

As shown in FIG. 8, a 2 mT external stray field may be assumed. In FIG. 8, the X-axis plots current in Amps, while the Y-axis plots the relative signal strength in percent. At zero current, the signal strength for both the low current chip (IC1), as well as the high current chip (IC2) is relatively higher. With increasing current, the relative signal strength dips for both chips, on the order of just 0.03% to 0.04%. Thus, the stray field suppression for both chips is very good.

Figure 11B:
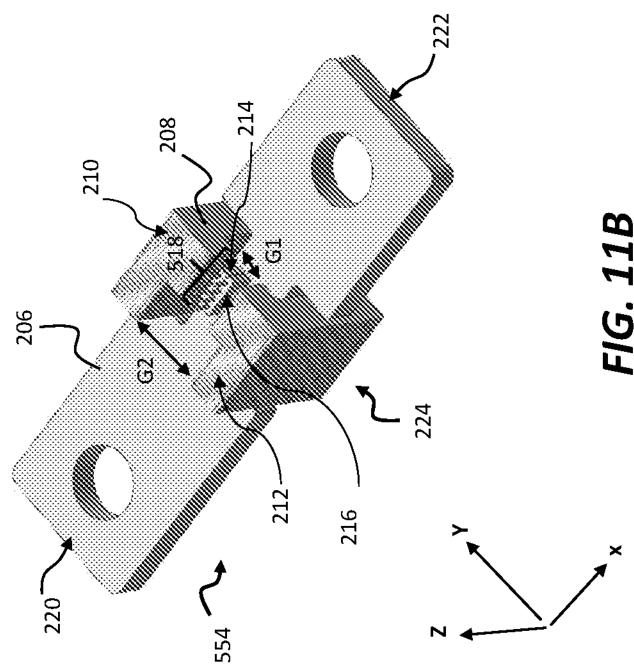
FIG. 11A-FIG. 12D show a top perspective view of additional hybrid current sensors, according to further embodiments of the disclosure.
Figure 11A:
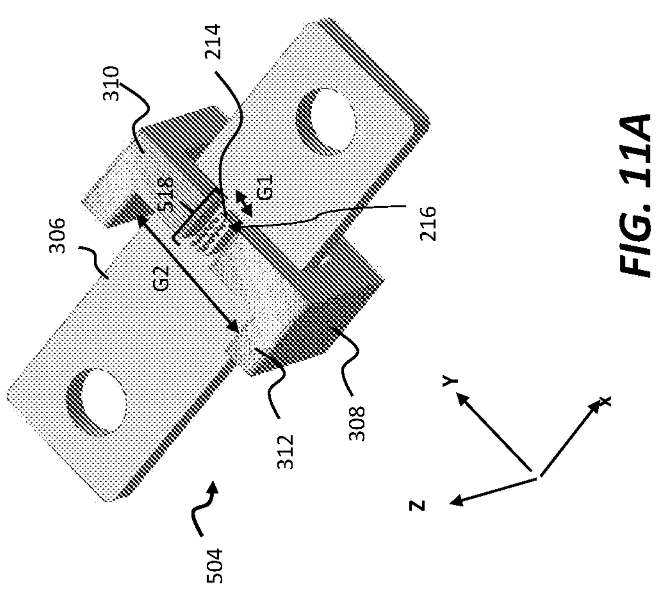

In additional embodiments of the disclosure, a plurality of sensor chips (chips) may be located within a given portion of a core gap region of a magnetic core. FIG. 11A-FIG. 12D show a top perspective view of additional hybrid current sensors, according to further embodiments of the disclosure. In the embodiments of FIG. 11A and FIG. 11B, two chips are disposed within a magnetic core gap region, at the location of the first portion of the respective magnetic core, where the gap is smaller. In the embodiments of FIGS. 12A-12D, a total of three chips are distributed within the core gap region, wherein at least one chip is distributed in the first portion and the second portion of a magnetic core.

Turning now to FIG. 11A in particular, there is shown a hybrid current sensor 504, in accordance with some embodiments of the disclosure. In this example, the overall structure of the hybrid current sensor 504 may be similar to the structure of hybrid current sensor 304, with like parts labeled the same. A difference is that a chip assembly 518 is provided where both the low current chip 214 and the high current chip 216 are disposed in the gap G1 in the hybrid current sensor 504. In one non-limiting example, the low current chip 214 may be configured to handle a low current range, e.g. +/−100 A while the high current chip 216 is configured to handle a high current range, e.g. +/−1500 A. In a different embodiment, both the low current chip 214 and high current chip 216 may be configured to handle a current range of +/−1500 A.

Turning now to FIG. 11B in particular, there is shown a hybrid current sensor 554, in accordance with some embodiments of the disclosure. In this example, the overall structure of the hybrid current sensor 554 may be similar to the structure of hybrid current sensor 204, with like parts labeled the same. A difference is that the chip assembly 518 is provided where both the low current chip 214 and the high current chip 216 are disposed in the gap G1 in the hybrid current sensor 504. In one non-limiting example, the low current chip 214 may be configured to handle a low current range, e.g. +/−100 A while the high current chip 216 is configured to handle a high current range, e.g. +/−1500 A. In a different embodiment, both the low current chip 214 and high current chip 216 may be configured to handle a current range of +/−1500 A.

Turning now to FIG. 12A in particular, there is shown a hybrid current sensor 604, in accordance with some embodiments of the disclosure. In this example, the overall structure of the hybrid current sensor 604 may be similar to the structure of hybrid current sensor 304, with like parts labeled the same. A difference is that a chip assembly 618 is provided in this embodiment where both the low current chip 214 and the high current chip 216 are disposed in the gap G1 in the hybrid current sensor 604. Another difference is that the chip assembly 618 in this embodiment includes a third chip 217 that is disposed in the gap G2 of second portion 312. In accordance with some non-limiting embodiments, low current chip 214 may handle low current measurement in a range of e.g. +/−100 A, while both the high current chip 216, disposed in gap G1, and third chip 217, in gap G2, which may be considered a an additional high current chip, may handle a high current measurement range of e.g. +/−1500 A, for functional safety purposes on redundant signals.

Turning now to FIG. 12B in particular, there is shown a hybrid current sensor 624, in accordance with some embodiments of the disclosure. In this example, the overall structure of the hybrid current sensor 624 may be similar to the structure of hybrid current sensor 604, with like parts labeled the same. A difference is that a chip assembly 628 is provided where both the high current chip 216 and the third chip 217 are disposed in the gap G2 of second portion 312. In accordance with some non-limiting embodiments, low current chip 214 may handle low current measurement in a range of e.g. +/−100 A, while both the high current chip 216, disposed in gap G1, and third chip 217, in gap G2, may handle a high current measurement range of e.g. +/−1500 A, for functional safety purposes on redundant signals.

Turning now to FIG. 12C in particular, there is shown a hybrid current sensor 644, in accordance with some embodiments of the disclosure. In this example, the overall structure of the hybrid current sensor 644 may be similar to the structure of hybrid current sensor 204, with like parts labeled the same. A difference is that a chip assembly 618 is provided where both the low current chip 214 and the high current chip 216 are disposed in the gap G1 in the hybrid current sensor 644. Another difference is that the chip assembly 618 includes a third chip 217 disposed in the gap G2 of second portion 212. In accordance with some non-limiting embodiments, low current chip 214 may handle low current measurement in a range of e.g. +/−100 A, while both the high current chip 216, disposed in gap G1, and third chip 217, in gap G2, may handle a high current measurement range of e.g. +/−1500 A, for functional safety purposes on redundant signals.

Figure 12:
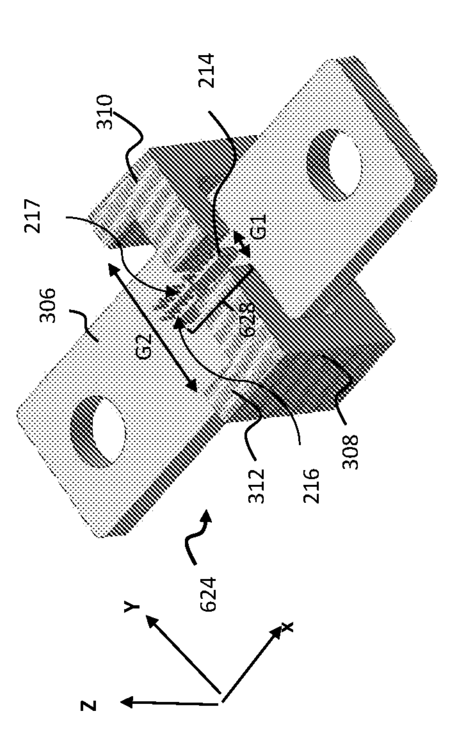
Figure 12D:
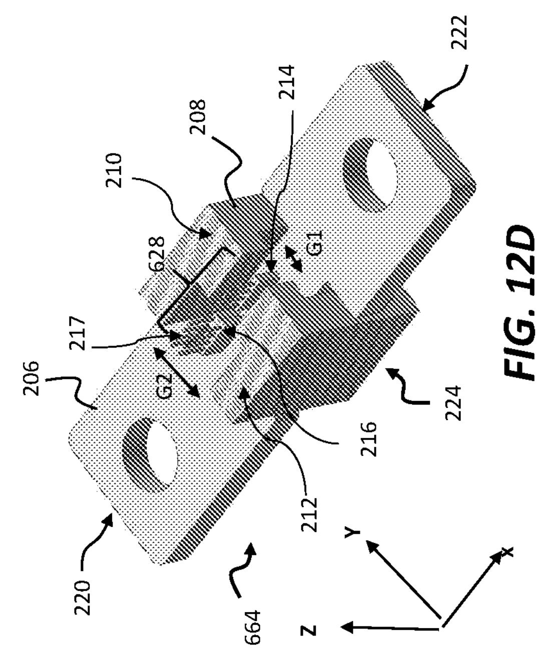
Figure 12:
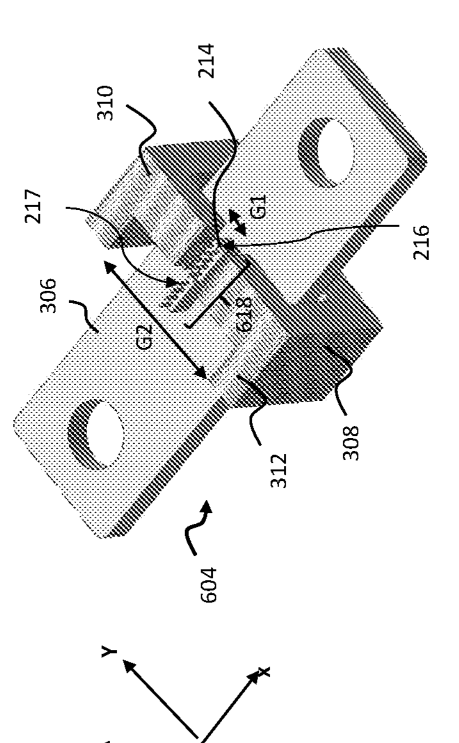
Figure 12:
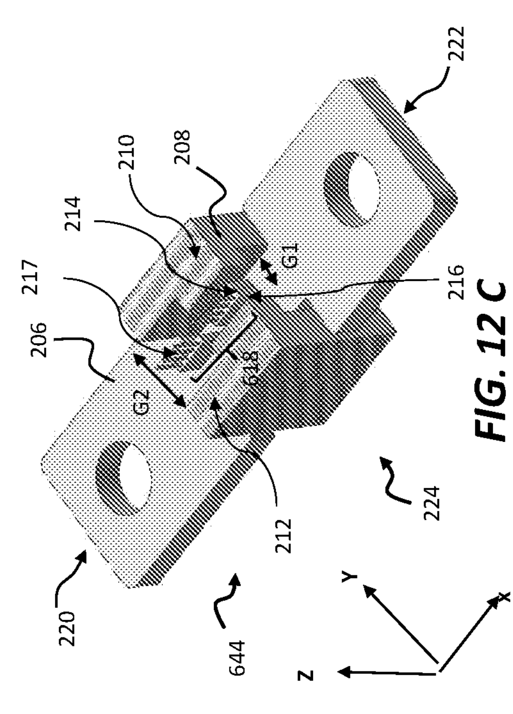

Turning now to FIG. 12D in particular, there is shown a hybrid current sensor 664, in accordance with some embodiments of the disclosure. In this example, the overall structure of the hybrid current sensor 664 may be similar to the structure of hybrid current sensor 644, with like parts labeled the same. A difference is that the chip assembly 628 is provided where both the high current chip 216 and the third chip 217 are disposed in the gap G2 of second portion 312. In accordance with some non-limiting embodiments, low current chip 214 may handle low current measurement in a range of e.g. +/−100 A, while both the high current chip 216, disposed in gap G1, and third chip 217, in gap G2, may handle a high current measurement range of e.g. +/−1500 A, for functional safety purposes on redundant signals.

In additional embodiments of the disclosure, a plurality of sensor chips (chips) may be located within a given portion of a core gap region of a magnetic core made from a single C-shaped portion. In the embodiments to follow, three separate sensor chips are provided within a gap formed by a C-shaped core.

FIG. 13A-FIG. 13B show a top perspective view of additional current sensors, according to further embodiments of the disclosure. In the embodiments of FIG. 13A and FIG. 13B, three chips are disposed within a magnetic core gap region, formed in the gap of a C-shaped magnetic core. Turning to FIG. 13A, there is shown a sensor arrangement 700, including a C-shaped magnetic core and busbar 706, which busbar may have a single notch in the gap region as shown. In this embodiment and other embodiments to follow, the C-shape core is, disposed at least partially around a middle portion of the main conductor, meaning the busbar 706, where the magnetic core is characterized by a C-shape at least around an outer surface.

A chip assembly 702, disposed in the core gap region, includes a low current chip 214, high current chip 216, and third chip 217, which may also be a high current chip. The high current chip 216 and third chip 217 may be arranged in a coplanar fashion with one another, as shown, while the low current chip 214 may be arranged below the plane of the high current chip 216 and third chip 217. For example, all these chips may function as Hall IC chips, with the low current chip 214 arranged for low current high accuracy measurement, such as in the range of +/−100 A, while the high current chip 216 and third chip 217 are arranged for detection in the high current range, such as +/−1500 A, providing functional safety by generating redundant signals. As further shown in FIG. 13A, each chip 214, 216, 217 of the chip assembly 702 may couple to a printed circuit board assembly (PCBA) 708, via a respective set of pin assemblies 214A, 216A, and 217A. In this example, the busbar 706 has a notch region as shown, wherein the chip assembly 702 is disposed adjacent the notch region. Note that the chip assembly is mechanically affixed to a PCB of the PCB assembly 708 via the set of pin assemblies, that is the set of pin assemblies 214A, 216A, and 217A. In this embodiment, and other embodiments the PCB assembly 708 is disposed in a vertical fashion, wherein a long direction of the PCB assembly 708 extends perpendicularly with respect to a long direction of the main conductor, busbar 706.

Turning to FIG. 13B there is shown a partially exploded view of an assembly 710, including the components of the sensor arrangement 700, when arranged within a housing 712, including a rear cover 714. Note that the vertical PCBA layout may be useful to increase PCBA area with a small sensor size. In this embodiment, and other embodiments to follow, the housing 712 is disposed at least partially around the PCB assembly 708 and the magnetic core. As shown in this embodiment, the housing may have an outer surface that has a C-shape, disposed adjacent a portion of the magnetic core, as well as the rear cover 714, disposed adjacent to the PCB assembly 708.

Figures 13, 14A, 14B, 14C:
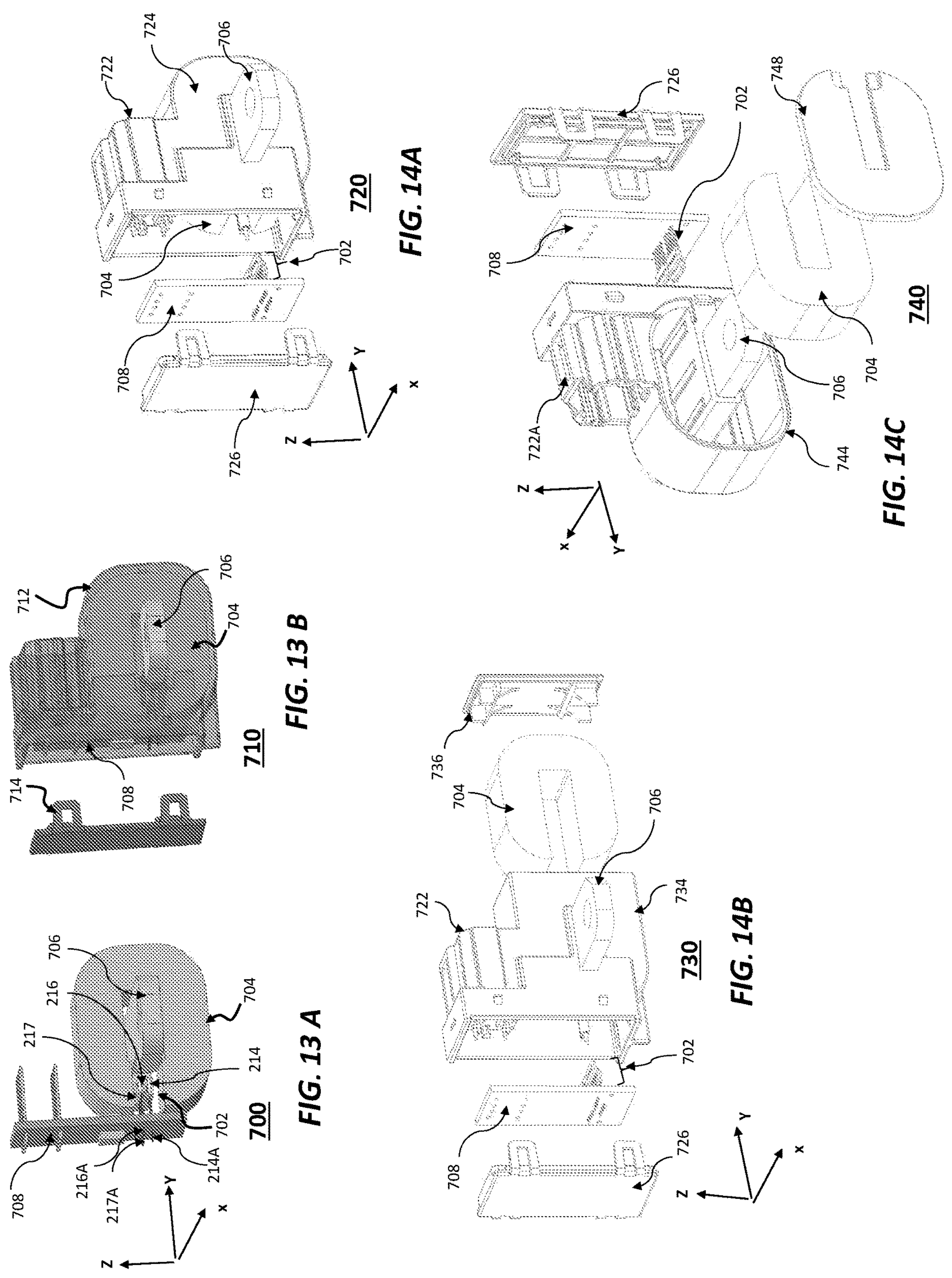
FIGS. 14A-14C show exploded views of different housing configurations that may be used in conjunction with sensor arrangements according to further embodiments.

Turning to FIGS. 14A-14C, there are shown exploded views of different housing configurations that may be used in conjunction with sensor arrangements similar to the sensor arrangement of 700 FIG. 13A. FIG. 14A depicts an arrangement 720, including a housing 724 is provided having a somewhat C-shape to surround the core 704, with a connector 722 above the housing, and a rear cover 726 to cover the PCBA 708 and couple to the housing 724.

Turning to FIG. 14B, there is shown an arrangement 730, including a housing 734, which is enclosed by both a front cover 736, disposed adjacent a continuous portion of the magnetic core, and a rear cover 726, disposed adjacent to the PCB assembly 708.

Turning to FIG. 14C, there is shown an arrangement 740, including a housing 744, a rear cover 726 and a side cover 748, as shown, disposed adjacent to a side of the magnetic core and extending perpendicularly to a long direction of the busbar 706.

Figure 15:
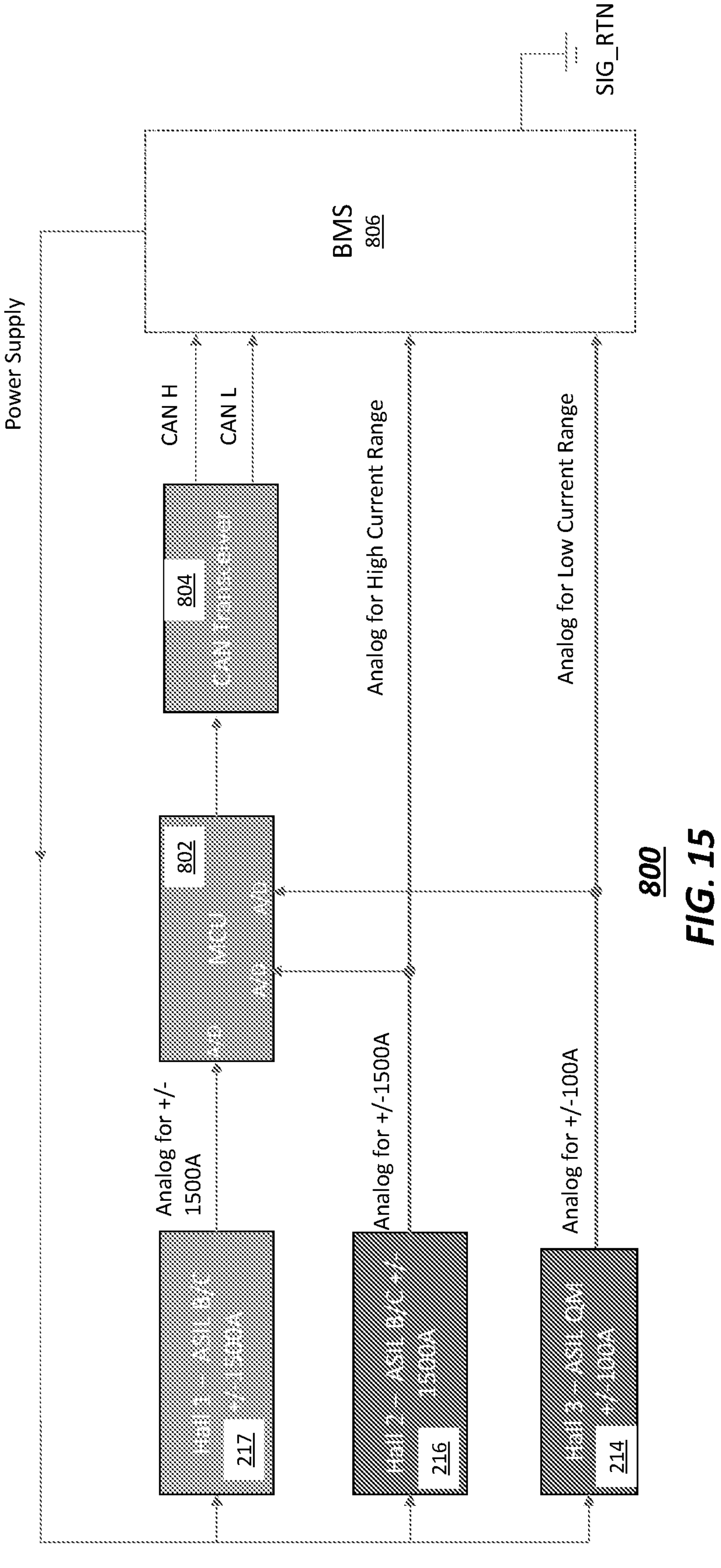
FIG. 15 shows an exemplary circuit arrangement.

Turning now to FIG. 15 there is shown an exemplary circuit arrangement 800. The exemplary circuit arrangement 800 depicts the general circuit arrangement for some of the sensor embodiments discussed previously, such as those embodiments of FIGS. 12A-13B. A battery management system (BMS) 806 and power supply are coupled to the low current chip 214 (which may be classified as ASIL QM), high current chip 216, and third chip 217 (which may be ASIL B/C rated). These three chips provide outputs that are conducted to a controller 802 via respective Analog/digital (A/D) interfaces. The controller 802 is coupled to a controller area network (CAN) transceiver, which in turn is connected to the BMS 806.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

While the present disclosure makes reference to certain embodiments, numerous modifications, alterations and changes to the described embodiments are possible without departing from the sphere and scope of the present disclosure, as defined in the appended claim(s). Accordingly, it is intended that the present disclosure not be limited to the described embodiments, but that it has the full scope defined by the language of the following claims, and equivalents thereof.

The invention claimed is:

1. A hybrid current sensor, comprising: a main conductor, having a first end and a second end, wherein a current flow direction of a main current in the main conductor extends between the first end and the second end; a magnetic core, disposed at least partially around a middle portion of the main conductor, the magnetic core having a C-shape at least around an outer surface, wherein the magnetic core defines a core gap region, the magnetic core comprising: a first portion having the C-shape that defines a first gap along a transverse direction; and a second portion having a U-shape that defines a second gap along the transverse direction, the second gap being greater than the first gap; and a chip assembly, disposed within the core gap region, wherein the chip assembly comprises a low current chip, and a pair of high current chips.

2. The hybrid current sensor of claim 1, wherein main conductor comprises a notch region, wherein the chip assembly is disposed adjacent the notch region.

3. The hybrid current sensor of claim 1, the low current chip and the pair of high current chips comprising a Hall sensor.

4. The hybrid current sensor of claim 1, wherein the pair of high current chips are disposed within a first plane in the core gap region, and wherein the low current chip is disposed within a second plane, different than the first plane, in the core gap region.

5. The hybrid current sensor of claim 1, the low current chip being adapted to measure the main current in a range up to five hundred amps, and the pair of high current chips being adapted to measure the main current in a range up to 2000 A.

6. The hybrid current sensor of claim 1, further comprising, a PCB assembly, wherein the chip assembly is mechanically affixed to a PCB of the PCB assembly via a set of pin assemblies.

7. The hybrid current sensor of claim 6, wherein the PCB assembly is disposed in a vertical fashion, wherein a long direction of the PCB assembly extends perpendicularly with respect to a long direction of the main conductor.

8. The hybrid current sensor of claim 7, further comprising a housing, disposed at least partially around the PCB assembly and the magnetic core.

9. The hybrid current sensor of claim 1, further comprising:

a PCB assembly, electrically coupled to the chip assembly; and a housing, disposed at least partially around the PCB assembly and the magnetic core.

10. The hybrid current sensor of claim 9, wherein the housing comprises:

an outer surface comprising a C-shape, disposed adjacent a portion of the magnetic core; and a back cover, disposed adjacent to the PCB assembly.

11. The hybrid current sensor of claim 10, further comprising a side cover, disposed adjacent to a side of the magnetic core and extending perpendicularly to a long direction of the main conductor.

12. The hybrid current sensor of claim 9, wherein the housing comprises: a front cover, disposed adjacent to a continuous portion of the magnetic core; and a back cover, disposed adjacent to the PCB assembly.

13. A battery system, comprising;

a battery to output a main current in a vehicle;

a hybrid current sensor, coupled to measure the main current along a current flow direction, the hybrid current sensor comprising:

a busbar structure having a first end and a second end;

a magnetic core, disposed at least partially around the busbar structure, the magnetic core defining a core gap region, the magnetic core comprising: —a first portion having a C-shape that defines a first gap along a transverse direction; and —a second portion having a U-shape that defines a second gap along the transverse direction, the second gap being greater than the first gap; and a chip assembly, disposed within the core gap region, wherein the chip assembly comprises a low current chip, and a pair of high current chips.

14. The battery system of claim 13, the low current chip being adapted to measure the main current in a range up to five hundred amps, and the pair of high current chips being adapted to measure the main current in a range up to 2000 A.

15. The battery system of claim 13, further comprising a PCB assembly, connected to the chip assembly, and disposed in a vertical fashion, wherein a long direction of the PCB assembly extends perpendicularly with respect to a long direction of the main conductor.

16. The battery system of claim 15, further comprising a housing, disposed at least partially around the PCB assembly and the magnetic core.

17. The battery system of claim 16, wherein the housing comprises: an outer surface comprising a C-shape, disposed adjacent a portion of the magnetic core; and a back cover, disposed adjacent to the PCB assembly.

18. The battery system of claim 17, further comprising a side cover, disposed adjacent to a side of the magnetic core and extending perpendicularly to a long direction of the busbar structure.

19. The battery system of claim 16, wherein the housing comprises: a front cover, disposed adjacent to a continuous portion of the magnetic core; and a back cover, disposed adjacent to the PCB assembly.

20. The battery system of claim 13, further comprising:

a controller, electrically coupled to receive an output from the low current chip and the pair of high current chips;

a controller area network transceiver, coupled to the controller; and a battery management system, coupled to receive an output from the controller area network transceiver.

* * * * *